(12) United States Patent
Choi

(10) Patent No.: US 7,659,177 B2
(45) Date of Patent: Feb. 9, 2010

(54) MANUFACTURING METHOD OF HIGH VOLTAGE SEMICONDUCTOR DEVICE THAT INCLUDES FORMING A NITRIDE LAYER ON SHALLOW TRENCH ISOLATIONS

(75) Inventor: Yong Keon Choi, Bucheon-si (KR)

(73) Assignee: Dongku Hitek Co., Ltd., Seoul (KR)

( * ) Notice: Subject to any disclaimer, the term of this patent is extended or adjusted under 35 U.S.C. 154(b) by 151 days.

(21) Appl. No.: 11/905,806

(22) Filed: Oct. 4, 2007

(65) Prior Publication Data
US 2008/0102600 A1 May 1, 2008

(30) Foreign Application Priority Data
Oct. 27, 2006 (KR) .................. 10-2006-0104778

(51) Int. Cl.
*H01L 21/762* (2006.01)
(52) U.S. Cl. ............... 438/401; 438/424; 438/527; 257/E21.639
(58) Field of Classification Search .............. 438/449
See application file for complete search history.

(56) References Cited

U.S. PATENT DOCUMENTS

| | | | |
|---|---|---|---|
| 6,451,640 B1 * | 9/2002 | Ichikawa ................ 438/199 |
| 6,514,810 B1 * | 2/2003 | Kim et al. ............... 438/232 |
| 7,205,630 B2 * | 4/2007 | Chang et al. ............. 257/500 |
| 7,414,292 B2 * | 8/2008 | Ema et al. ............... 257/369 |
| 2005/0087810 A1 * | 4/2005 | Sadra et al. ............. 257/368 |
| 2006/0118854 A1 * | 6/2006 | Lee ...................... 257/315 |
| 2007/0066087 A1 * | 3/2007 | Jung .................... 438/786 |

* cited by examiner

Primary Examiner—Stephen W Smoot
(74) Attorney, Agent, or Firm—Finnegan, Henderson, Farabow, Garrett & Dunner, L.L.P.

(57) ABSTRACT

Disclosed is a semiconductor device, and more particularly, a manufacturing method of a high voltage semiconductor device. The method includes: forming a semiconductor substrate having a key area for an alignment key, a low voltage area for a low voltage device, and a high voltage area for a high voltage device; forming an oxide film on the substrate; and forming an insulating film on the oxide film. After removing the insulating film, the method includes forming a plurality of shallow trench isolations (STI's) in the areas of the substrate; forming a nitride layer on the substrate and on STIs; sequentially forming a plurality of wells and drift areas by implanting an impurity ion into the high voltage area; and sequentially forming the plurality of wells and the drift areas by implanting an impurity ion into the low voltage area. A system on chip (SOC) process may thus be simplified.

9 Claims, 4 Drawing Sheets

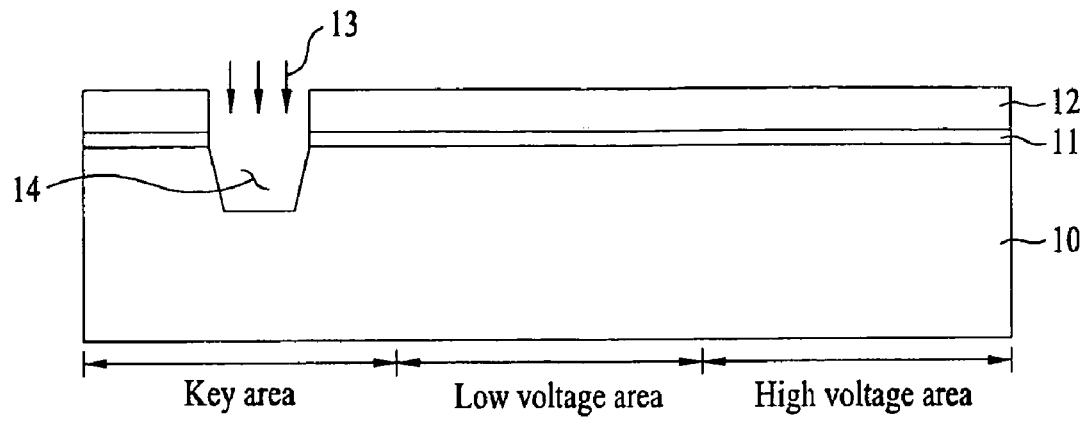
FIG.1A  Conventional Process
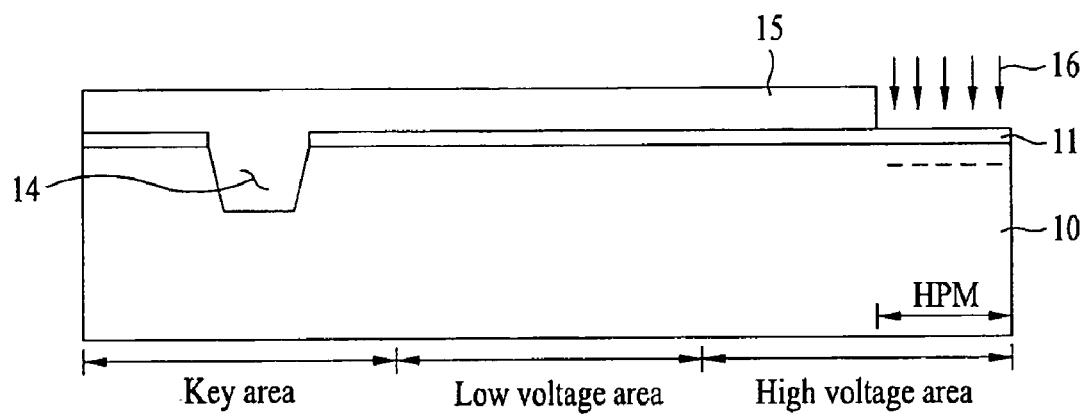
FIG.1B  Conventional Process
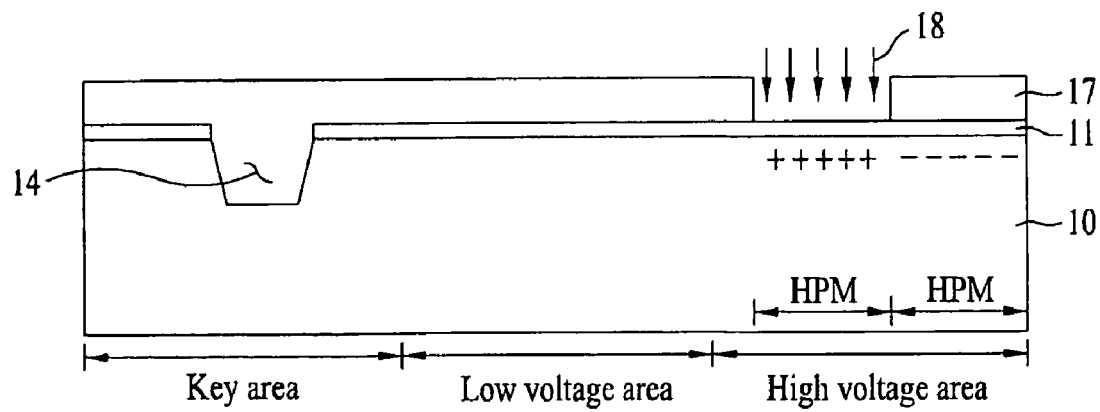
FIG.1C  Conventional Process

FIG.1D  Conventional Process
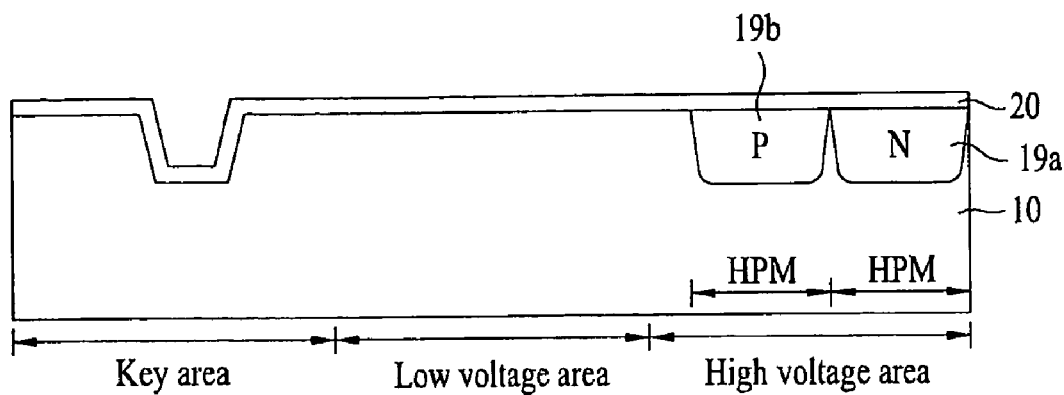
FIG.2A
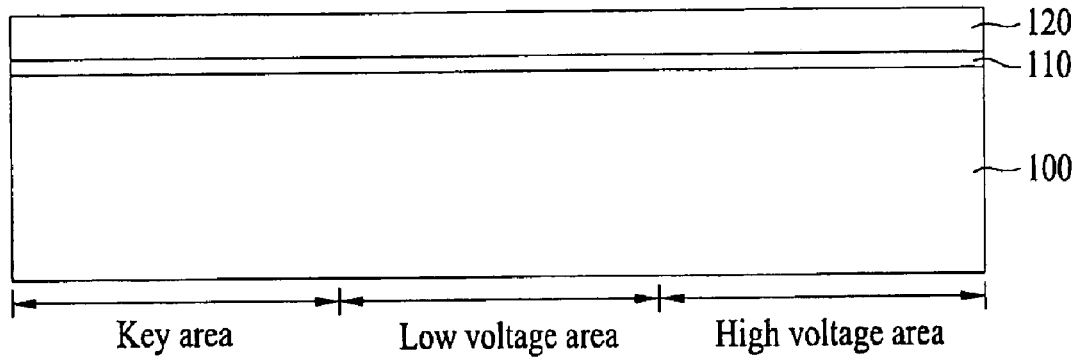
FIG.2B
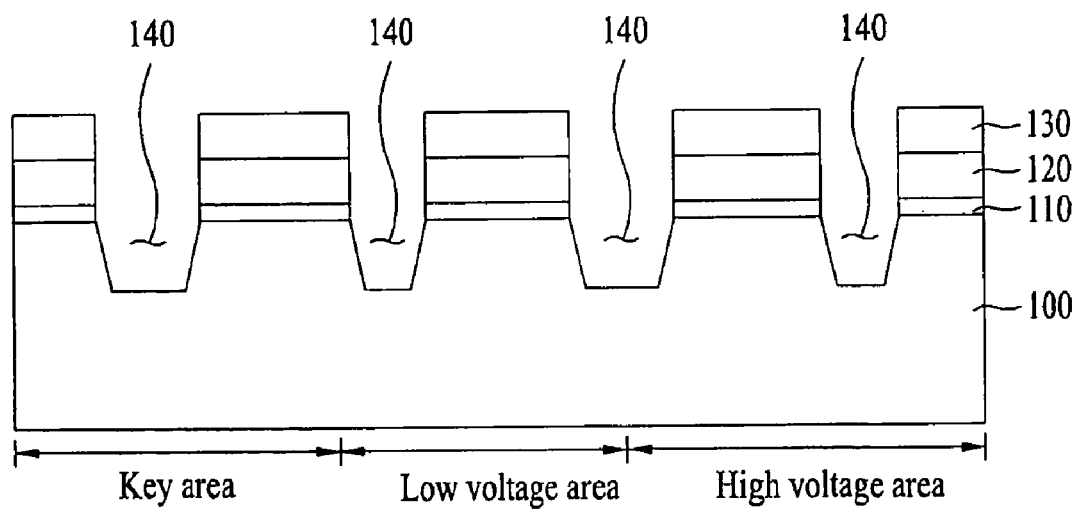

MANUFACTURING METHOD OF HIGH VOLTAGE SEMICONDUCTOR DEVICE THAT INCLUDES FORMING A NITRIDE LAYER ON SHALLOW TRENCH ISOLATIONS

This application is based upon and claims the benefit of priority to Korean Patent Application No. 10-2006-0104778, filed on Oct. 27, 2006, the entire contents of which are incorporated herein by reference.

TECHNICAL FIELD

The present invention relates to a semiconductor device, and more particularly to a manufacturing method of a high voltage semiconductor device.

BACKGROUND

Generally, a manufacturing process of a high voltage semiconductor device requiring high voltage is applied to various technologies such as liquid crystal displays (LCDs), driving integrated circuits, organic light emitting diodes (OLEDs), power integrated circuits, etc.

The manufacturing process of the high voltage semiconductor device can use a method of integrating a high voltage device, a middle voltage device, and a low voltage device in the form of a system on chip (SOC).

The high voltage device manufactured through the manufacturing process of the high voltage semiconductor device should have high voltage operating characteristics, that is, high breakdown voltage characteristic. Therefore, a high-temperature diffusion process is performed for a long time to form a well of a high voltage device. Also, in order to form the well, a photo alignment key is required. Also, in order to form the photo alignment key, a zero process is performed.

The zero process is a process of purely forming the photo alignment key without having a direct relation in implementing an actual device.

In detail, a conventional process for manufacturing a high voltage semiconductor device in the related art will be described with reference to FIGS. 1A to 1D.

FIGS. 1A to 1D are cross-sectional views of a process for explaining a manufacturing method of a semiconductor device for a SOC integrated circuit according to the related art.

First, as shown in FIG. 1A, an oxide film 11 is formed on a semiconductor substrate 10 defined by a key area (Key) to be formed with an alignment key, a low voltage area (LV) to be formed with a low voltage device (or, a middle voltage device), and a high voltage area (HV) to be formed with a high voltage device.

Next, a first mask process is performed to form a first photoresist pattern 12 so that a portion of the semiconductor substrate 10 of the key area is exposed on the oxide film 11.

Next, a trench 14 is formed in the semiconductor substrate 10 of the exposed key area by performing an etching process 13 using the first photoresist pattern 12 as a mask. At this time, the trench 14 serves as the alignment key between the semiconductor substrate 10 and the mask equipment.

Next, as shown in FIG. 1B, after removing the first photoresist pattern 12, a second photoresist pattern 15 is formed on the oxide film 11 including the trench 14 through a second mask process. At this time, the second photoresist pattern 15 is formed to have a structure that a high voltage PMOS area (HPM) to be formed with a high voltage PMOS transistor is opened, on the basis of the alignment key.

Next, the semiconductor substrate 10 of the high voltage PMOS area (HPM) is doped with an N type impurity by performing an ion implant process 16 using the second photoresist pattern 15 as the mask.

Next, as shown in FIG. 1C, after removing the second photoresist pattern 15, a third photoresist pattern 17 is formed on the oxide film 11 including the trench 14 through a third mask process. At this time, a third photoresist pattern 17 is formed to have a structure that a high voltage NMOS area (HNM) to be formed with a high voltage NMOS transistor is opened, on the basis of the alignment key.

Next, an ion implant process 18 is performed using the third photoresist pattern 17 as the mask. Therefore, the semiconductor substrate 10 of the high voltage NMOS area (HNM) is doped with a P type impurity.

Next, as shown in FIG. 1D, after removing the third photoresist pattern 17, the doped N type impurity and P type impurity are diffused by performing a high-temperature thermal diffusion process for a long time. Thereby, the semiconductor substrate 10 of the high voltage PMOS area (HPM) and the semiconductor substrate 10 of the high voltage NMOS area (HNM) are formed with an N-well 19a and a P-well 19b. At this time, a thermal oxide film 20 can be formed on the surface of the semiconductor substrate 10 including the trench 14 by means of the heat applied when performing the thermal diffusion process.

Next, a plurality of device isolating layers for isolating the key area (Key), the high voltage area (HV), and the low voltage area (LV) are formed by performing the shallow trench isolation (STI) process.

Next, the high voltage NMOS and PMOS transistors are formed on the semiconductor substrate 10 of the high voltage area (HV). The low voltage NMOS and PMOS transistors are formed on the semiconductor substrate 10 of the low voltage area (LV), according to the known art.

In other words, as can be appreciated from FIGS. 1A to 1D, the related art forms the photo alignment key required for forming the well in the high voltage device. And, the zero process is performed for forming the photo alignment key.

Therefore, the manufacturing process of the semiconductor device is complicated and the manufacturing cost thereof is higher than desired.

SUMMARY

There is provided a manufacturing method of a high voltage semiconductor device which may simplify the process of manufacturing a system on chip (SOC).

The disclosed method may simplify the process and improve reliability by manufacturing the device without performing a zero process for forming a photo alignment key.

In particular, there is provided a manufacturing method of a high voltage semiconductor device comprising various steps including: forming a semiconductor substrate defined by a key area to be formed with an alignment key, a low voltage area to be formed with a low voltage device, and a high voltage area to be formed with a high voltage device. Further, the manufacturing method includes the steps of forming an oxide film on the semiconductor substrate and forming an insulating film on the oxide film. After removing the insulating film, a plurality of shallow trench isolations (STI) may be formed in each area defined in the semiconductor substrate. Still further, a nitride layer may be formed on the semiconductor substrate including the plurality of STIs and then a plurality of wells and drift areas may be sequentially formed by implanting an impurity ion into the high voltage area. Lastly, a plurality of wells and the drift areas may be sequentially formed by implanting an impurity ion into the low voltage area.

The insulating film may be formed of any one of a high temperature, low pressure dielectric and a silicon nitride-based material.

The inside of the plurality of STIs may be formed with a liner oxide film, the liner oxide film being formed to be connected to the oxide film. Herein, the liner oxide film is formed and the plurality of STIs is then filled and buried with oxide.

The nitride layer may be formed using an atomic layer deposition (ALD) method.

The step of forming the plurality of wells and the drift areas in the high voltage area may comprise forming an N-well and a P-well in the high voltage area through an ion implant process and a high temperature annealing process. After implanting an impurity ion in the substrate of the high voltage area, a drive-in process annealing it at 1100° C. for several hours can be performed.

The high voltage area may be formed with the N-well and the P-well, the P-well is formed with a low-concentration N-drift area and the N-well is formed with a low-concentration P-drift area.

The step of forming the plurality of wells and the drift areas in the low voltage area may comprise forming the N-well and the P-well in the low voltage area through the ion implant. After implanting an impurity ion into the substrate of the low voltage area, a drive-in process annealing it at 1100° C. for several hours can be performed.

The low voltage area may be formed with the N-well and the P-well, the P-well is formed with a low-concentration N-drift area and the N-well is formed with a low-concentration P-drift area.

BRIEF DESCRIPTION OF THE DRAWINGS

The accompanying drawings, which are included to provide a further understanding of the invention and are incorporated in and constitute a part of this application, illustrate embodiments consistent of the invention and together with the description serve to explain the principles of the invention. In the drawings:

FIGS. 1A to 1D are cross-sectional views of a process for explaining a manufacturing method of a semiconductor device for a SOC integrated circuit according to the related art.

FIGS. 2A to 2D are cross-sectional views of a manufacturing method of a high voltage semiconductor device according to one exemplary embodiment.

DETAILED DESCRIPTION

Hereinafter, an embodiment will be described with reference to the accompanying drawings.

The description of the technical contents that is well known to those skilled in the art and is not directly related to the present application will be omitted.

FIGS. 2A to 2D are cross-sectional views of a manufacturing method of a high voltage semiconductor device according to an embodiment consistent with the present invention.

First, as shown in FIG. 2A, a semiconductor substrate 100 defined by a key area to be formed with an alignment key, a low voltage area to be formed with a low voltage device (or, a middle voltage device), and a high voltage area to be formed with a high voltage device is formed.

Next, a first oxide film 110 performing a buffering function is formed on the semiconductor substrate 100 by performing a thermal oxidation process.

Next, an insulating film 120 is formed on the first oxide film 110, At this time, the insulating film 120 can be formed of a high temperature low pressure dielectric (HLD) film or a silicon nitride-based material.

Next, as shown in FIG. 2B, a photoresist pattern 130 is formed on the insulating film 120. Herein, the photoresist pattern 130 can be formed by coating a photoresist (not shown) and performing exposure and developing processes using a photo mask.

Figure 2C:
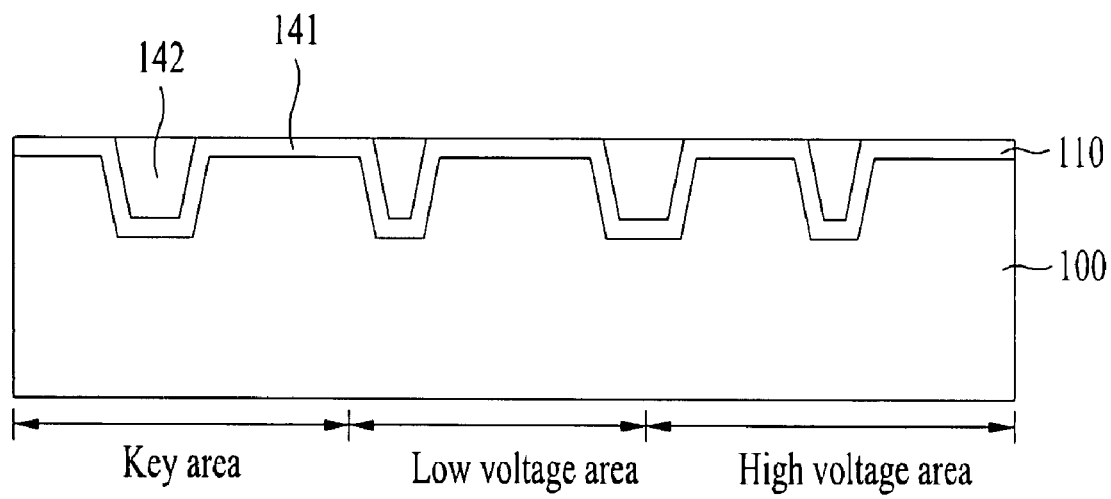

As shown in FIG. 2C, the photoresist pattern 130 can be formed to have a structure that some of the key area, the low voltage area, and the high voltage area, that is, an area to be formed with a shallow trench isolation (STI) 142 is opened.

Next, an etching process is performed using the photoresist pattern 130 as a mask. Therefore, a plurality of trenches 140 etched up to the insulating film 120, the first oxide film 110, and the semiconductor substrate 100 is formed.

Next, the photoresist pattern 130 and the insulating film 120 are removed by performing a strip process. Thereafter, the respective insides of the plurality of trenches 140 are formed with a liner oxide film 141. The liner oxide film 141 is formed to be connected to the first oxide film 110 previously formed.

After forming the liner oxide film 141, the trench 140 is buried by filling oxide such as $SiO_2$ etc., for burying the trench 140. Then, as shown in FIG. 2C, the plurality of STIs 140 are formed in the key area, the low voltage area, and the high voltage area.

Figure 2D:
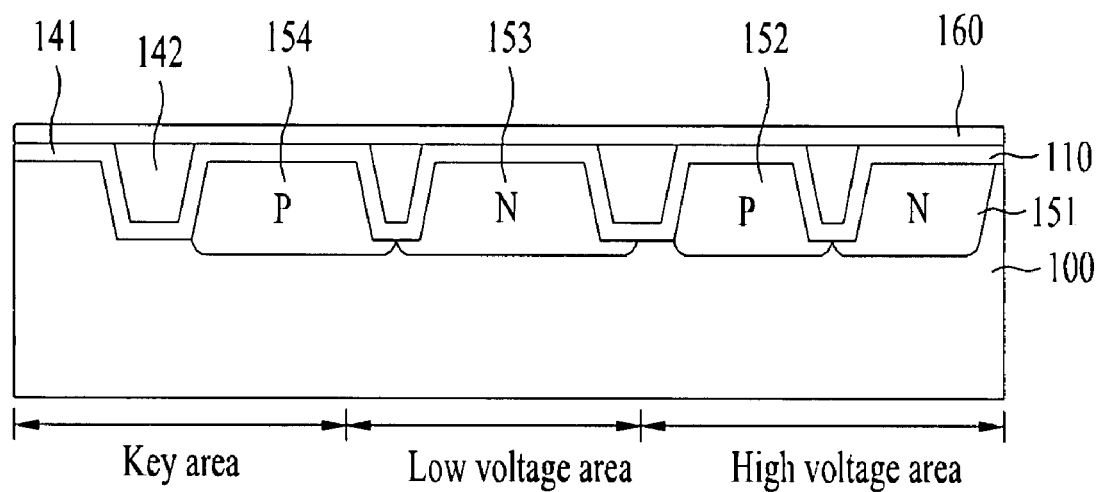

Next, as shown in FIG. 2D, a nitride layer 160 is formed on the plurality of STIs 140 and the oxide film 110 using an atomic layer deposition (ALD) method.

The ALD method is a method that adsorbs molecules into a surface and then substitutes them by using a chemically sticking phenomenon, wherein the ALD method alternatively performs adsorption and substitution. The use of the ALD method can make the deposition in a uniform lattice arrangement and can form the nitride layer 160 as thinly as possible.

Also, the ALD method can form an excellent film at a lower temperature (500° C. or less) than a MOCVD so that it is suitable for a system on chip (SoC) process.

In the disclosed method, the reason for forming the nitride layer 160 using the ALD method is to relieve a stress applied to the STI 142, wherein as the STI 142 is formed and the well forming process is performed, the stress is generated due to a high temperature and a long process time required for forming the well.

Also, in order to solve the problem of a Si pit, and the like caused when the well forming process is performed, $O_2$ is generally pushed. At this time, the surface of the STI 142 is oxidized by means of the $O_2$ so that the stress is increased. Such a problem may be solved by forming the nitride layer 160 and then forming the well or the drift area as disclosed herein. As a result, the surface of the STI 142 is not oxidized by means of the nitride layer 160 so that the stress applied to the STI 142 may be reduced.

Next, as shown in FIG. 2D, the ion implant process, which implants an impurity ion into the semiconductor substrate 100 of the high voltage area using the plurality of photoresist patterns (not shown) as the mask, is performed. And, an N-well 151 and a P-well 152 are formed in the high voltage area by performing a high temperature annealing process.

Next, a drive-in process that implants an impurity ion into the semiconductor substrate 100 and anneals it at 1100° C. for several hours is performed. Therefore, the low-concentration N-drift area is formed in the P-well 152 of the high voltage area and the low-concentration P-drift area is formed in the N-well 151 of the high voltage area.

After forming the drift area in the high voltage area, an N-well 153 and a P-well 154 are formed by implanting an impurity ion into the low voltage area using the plurality of photoresist patterns (not shown) as the mask. And, the drive-in process that implants an impurity ion into the low voltage area and anneals it at 1100° C. for several hours is performed.

The low-concentration N-drift area is formed in the P-well 154 of the low voltage and the low-concentration P-drift area is formed in the N-well 153.

Next, a plurality of gates are formed to form the high voltage device and the low voltage device. In other words, a low voltage NMOS transistor and a low voltage PMOS transistor are formed on the semiconductor substrate 110 of the low voltage area and a high voltage NMOS transistor and a high voltage PMOS transistor are formed on the semiconductor substrate 110 of the high voltage area.

Accordingly, the STI has a sharp corner portion in the well forming process and the drive-in process, unlike the Locos isolation. And, the portion is vulnerable to the stress generated by means of the well forming process. Therefore, in order to reduce the stress applied to the STI, which is generated in the well forming process, the disclosed method forms a structure having the oxide/nitride layer 160 of the semiconductor substrate Si/STI by forming the nitride layer 160 prior to forming the well.

Figure 3:
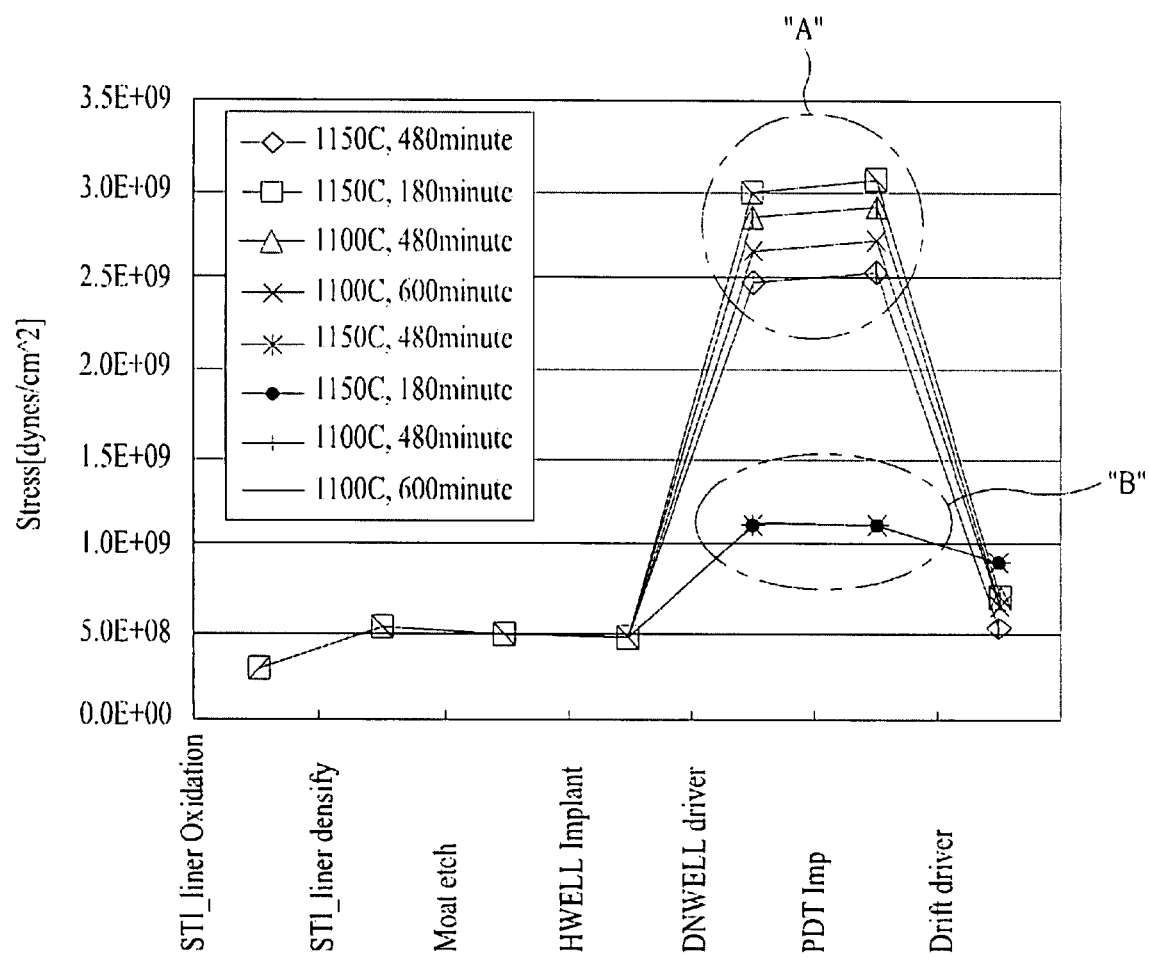
FIG. 3 is a graph explaining a performance of a high voltage semiconductor device according to one exemplary embodiment.

This can be appreciated from the case where the nitride layer 160 represented by "A" in FIG. 3 is not formed and the case where the nitride layer 160 of the disclosed method represented by "B" in FIG. 3 is formed.

In other words, the nitride layer 160 is formed prior to forming the well, to form the structure of the oxide/nitride layer 160 of the semiconductor substrate (Si)/STI, so that the compressive-tensile stress between the materials with different thermal expansion coefficients is offset, making it possible to minimize the stress applied to the semiconductor substrate.

While the well of the high voltage device is generally formed by performing the zero process and the mask process performed three times, the disclosed method may minimize the stress without performing the zero process. Therefore, the high voltage device with an improved reliability can be formed.

It will be apparent to those skilled in the art that various modifications and variations may be made in the present invention without departing from the spirit and scope consistent with the invention as defined by the appended claims.

What is claimed is:

1. A manufacturing method of a high voltage semiconductor device, comprising:

forming a semiconductor substrate, the substrate being defined by a key area for an alignment key, a low voltage area for a low voltage device, and a high voltage area for a high voltage device;

forming an oxide film on the substrate;

forming an insulating film on the oxide film;

after removing the insulating film, forming a plurality of shallow trench isolations (STI's) in the key area, the low voltage area, and the high voltage area;

forming a nitride layer on the substrate and on the plurality of STIs;

sequentially forming a plurality of high voltage area wells and high voltage area drift areas by implanting an impurity ion into the high voltage area; and sequentially forming a plurality of low voltage area wells and low voltage area drift areas by implanting an impurity ion into the low voltage area after sequentially forming the plurality of high voltage area wells and high voltage area drift areas.

2. The method according to claim 1, wherein the insulating film is formed of any one of a high temperature low pressure dielectric (HLD) and a silicon nitride-based material.

3. The method according to claim 1, wherein the inside of the plurality of STIs is formed with a liner oxide film, the liner oxide film being connected to the oxide film.

4. The method according to claim 3, wherein the liner oxide film is formed and the plurality of STIs are then filled and buried with oxide.

5. The method according to claim 1, wherein the nitride layer is formed using an atomic layer deposition (ALD) method.

6. The method according to claim 1, wherein the step of forming the plurality of high voltage area wells and high voltage area drift areas in the high voltage area comprises:

forming an N-well and a P-well in the high voltage area through an ion implant process and a high temperature annealing process; and after implanting an impurity ion in the substrate of the high voltage area, performing a drive-in process annealing it at about 1100° C. for at least one hour.

7. The method according to claim 1, wherein the high voltage area is formed with an N-well and a P-well, the P-well is formed with a low-concentration N-drift area and the N-well is formed with a low-concentration P-drift area.

8. The method according to claim 1, wherein the step of forming the plurality of low voltage area wells and low voltage area drift areas in the low voltage area comprises:

forming an N-well and a P-well in the low voltage area through the ion implant; and after implanting an impurity ion into the substrate of the low voltage area, performing a drive-in process annealing it at about 1100° C. for at least one hour.

9. The method according to claim 1, wherein the low voltage area is formed with an N-well and a P-well, the P-well is formed with a low-concentration N-drift area and the N-well is formed with a low-concentration P-drift area.

* * * * *